(12) United States Patent  
Habibi et al.

(10) Patent No.: US 10,861,489 B1
(45) Date of Patent: Dec. 8, 2020

(54) HEAT-ASSISTED MAGNETIC RECORDING DEVICE INCLUDING A SLIDER HAVING AN ON-WAFER-LASER

(71) Applicant: Seagate Technology LLC, Cupertino, CA (US)

(72) Inventors: Helene Parwana Habibi, Londonderry (GB); Daniela Diamare, Londonderry (GB); Thomas Liam White, Londonderry (GB); Gavin Lee Brinkley, Londonderry (GB)

(73) Assignee: Seagate Technology, Fremont, CA (US)

( * ) Notice: Subject to any disclaimer, the term of this patent is extended or adjusted under 35 U.S.C. 154(b) by 0 days.

(21) Appl. No.: 16/211,945

(22) Filed: Dec. 6, 2018

Related U.S. Application Data

(63) Continuation of application No. 15/667,197, filed on Aug. 2, 2017, now abandoned.

(51) Int. Cl.
| | |
|---|---|
| *G11B 11/105* | (2006.01) |
| *G11B 5/48* | (2006.01) |
| *H01S 5/022* | (2006.01) |
| *H01S 5/024* | (2006.01) |
| *G11B 5/00* | (2006.01) |
| *G11B 5/60* | (2006.01) |

(52) U.S. Cl.
CPC .......... *G11B 5/4866* (2013.01); *H01S 5/0228* (2013.01); *H01S 5/02469* (2013.01); *G11B 5/6088* (2013.01); *G11B 2005/0021* (2013.01)

(58) Field of Classification Search
USPC .... 369/13.01–13.55, 112.09, 112.14, 112.21, 369/112.27, 300; 360/59, 123.02–125.75, 360/131; 385/11–14, 31, 88–94, 385/123–132, 141–145; 29/603.07–603.27
See application file for complete search history.

(56) References Cited

U.S. PATENT DOCUMENTS

| | | | |
|---|---|---|---|
| 6,771,589 B2 | 8/2004 | Ueyanagi et al. | |
| 8,134,794 B1 * | 3/2012 | Wang .................... | G11B 5/314 369/13.13 |
| 8,418,353 B1 * | 4/2013 | Moravec ............... | G11B 5/314 369/13.33 |
| 8,456,969 B1 | 6/2013 | Mooney et al. | |
| 8,501,536 B2 | 8/2013 | Mooney et al. | |
| 9,147,427 B1 * | 9/2015 | Lee ...................... | G11B 5/3133 369/13.32 |
| 9,576,595 B1 * | 2/2017 | Hipwell, Jr. ......... | G11B 5/1272 |
| 9,607,638 B1 * | 3/2017 | Olson ................... | G11B 5/105 |
| 9,799,359 B1 | 10/2017 | Olson et al. | |
| 9,875,761 B1 * | 1/2018 | Mehfuz ................ | G02B 3/0087 |

(Continued)

*Primary Examiner* — Tan X Dinh
(74) *Attorney, Agent, or Firm* — Mueting Raasch Group

(57) ABSTRACT

An apparatus includes a substrate and a reader deposited on the substrate. A laser is formed on a non-self supporting structure and bonded to the substrate. A plurality of heat sink layers are deposited between the reader and the laser and configured to provide thermal coupling between the substrate and the laser and sink heat away from the laser. A waveguide is deposited proximate the laser. The waveguide is configured to communicate light from the laser to a near-field transducer that directs energy resulting from plasmonic excitation to a recording medium.

20 Claims, 9 Drawing Sheets

(56) References Cited

U.S. PATENT DOCUMENTS

| | | | |
|---|---|---|---|
| 10,310,182 B2 * | 6/2019 | Ju | G02B 6/1226 369/13.33 |
| 2005/0213436 A1 | 9/2005 | Ono et al. | |
| 2006/0256481 A1 | 11/2006 | Kagami et al. | |
| 2008/0239541 A1 | 10/2008 | Shimazawa et al. | |
| 2009/0188891 A1 * | 7/2009 | Tanaka | G11B 5/314 216/22 |
| 2011/0043941 A1 * | 2/2011 | Champion | B82Y 10/00 369/13.33 |
| 2011/0128827 A1 | 6/2011 | Shimazawa et al. | |
| 2011/0243176 A1 * | 10/2011 | Mooney | G11B 5/105 372/50.124 |
| 2011/0267930 A1 | 11/2011 | Hurley et al. | |
| 2012/0063025 A1 * | 3/2012 | Wilson | G11B 5/012 369/13.33 |
| 2012/0099407 A1 | 4/2012 | Hipwell et al. | |
| 2013/0016591 A1 | 1/2013 | Tomikawa | |
| 2015/0036468 A1 | 2/2015 | Boone, Jr. | |
| 2015/0043316 A1 | 2/2015 | Rea et al. | |
| 2015/0154995 A1 * | 6/2015 | Chen | G11B 5/746 369/13.33 |

* cited by examiner

HEAT-ASSISTED MAGNETIC RECORDING DEVICE INCLUDING A SLIDER HAVING AN ON-WAFER-LASER

RELATED PATENT DOCUMENTS

This application is a continuation of U.S. Ser. No. 15/667,197, filed on Aug. 2, 2017, to which priority is claimed and which is incorporated herein by reference in its entirety.

SUMMARY

Embodiments described herein are directed to an apparatus comprising a substrate and a reader deposited on the substrate. A laser is formed on a non-self supporting structure and bonded to the substrate. A plurality of heat sink layers are deposited between the reader and the laser and configured to provide thermal coupling between the substrate and the laser and sink heat away from the laser. A waveguide is deposited proximate the laser. The waveguide is configured to communicate light from the laser to a near-field transducer that directs energy resulting from plasmonic excitation to a recording medium.

Embodiments are directed to a structure that is transfer-printed and bonded to a substrate of a recording head. A plurality of heat sink layers are deposited between the substrate and the structure and configured to provide thermal coupling between the recording head and the structure and to sink heat away from the structure.

A method, comprises depositing a read transducer on a substrate. A plurality of heat sink layers are deposited over the read transducer. A laser diode unit is transfer printed over the plurality of heat sink layers. A waveguide core is deposited over the laser diode unit, wherein the plurality of heat sink layers are configured to provide thermal coupling between the laser diode unit and the substrate and to sink heat away from the laser diode unit.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification, reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
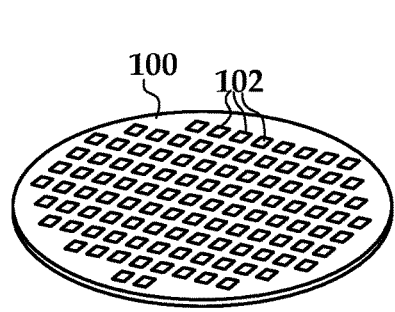
FIGS. 1-5 are diagrams showing a transfer printing process in accordance with embodiments described herein.

This disclosure relates to read/write heads used in heat-assisted magnetic recording (HAMR), also referred to as thermally-assisted recording (TAR), thermally-assisted magnetic recording (TAMR), energy-assisted magnetic recording (EAMR), etc. In this disclosure the terms "read/write head," "slider," and "head" will be used interchangeably. In a HAMR device, a read/write head includes an energy source (e.g., a laser diode) that heats a recording medium during writing. The HAMR read/write head generally includes some form of optical transmission path, such as a waveguide and near-field transducer, that shapes and directs the energy from the energy source to the recording medium.

In some implementations, the read/write head and laser diode are formed using separate processes, aligned using a surface-mount placement process (e.g., pick and place), and bonded together (e.g., using solder). While this type of assembly process is well-established for assembly of electronic components, there are challenges in mass-assembly of HAMR read/write heads using these processes.

One challenge in assembling laser diodes onto a read/write head is the precise alignment needed. While electrical components can operate if misaligned so long as the conductive paths are sufficiently established, misalignment between a laser and read/write head can result in a loss of optical efficiency that can render the head unusable. Another challenge relates to the size of the resulting assembly. The read/write head has a limited vertical distance (normal to the recoding surface) in which to operate. In some implementations, the addition of a laser and intermediate structures (e.g., submounts) can exceed the available spacing. Such additional structure can add undesirable weight, as do the laser packaging and electrical joints that electrically couple the laser to the read/write head.

In the present disclosure, hard drive recording heads are used onto which at least part of a semiconductor laser (e.g., crystalline, epitaxial layer) is not self-supporting (e.g., not a separately packaged device) but is physically carried by same substrate that carries the other components of the read/write head (e.g., write coil and poles, reader stack) without the use of a separate or intermediate support during attachment. Carrying the semiconductor laser with the read/write head substrate, without a separate or intermediate support substrate, can help to reduce the size and weight of the head, and it can also allow for the use of laser geometries and designs that are very different from simple edge-emitting cleaved facet lasers that have been proposed in the past. A laser heat sink may be provided that is configured to reduce the temperature of the laser diode and various surrounding structures. The heat sink may also be used to provide good thermal coupling between the laser diode and the substrate and other surrounding components of the hard drive recording head.

In at least some cases, parts of the laser (e.g., GaAs active region) are incompatible with epitaxial growth on the substrate. As such, the laser cannot be formed using the same layer deposition processes used to form the magnetic and optical components that are integrated into the head. In embodiments described below, the laser may instead be formed on the substrate by transfer printing a thin, non-self-supporting crystalline layer (epitaxial layer), or a stack of such layers, from a growth substrate on which they were formed to a target substrate. Thereafter, the epitaxial layer and substrate are further processed (e.g., masked etched, further layers added) to form the slider-integral laser.

This process of transferring non-self-supporting layers of epitaxial-growth-incompatible layers is referred to herein as On-Wafer Laser (OWL) process integration. This process may also be referred to as transfer printing, dry transfer printing, nanoprinting, etc. In FIGS. 1-5, block diagrams illustrate transfer printing of components onto a recording head according to an example embodiment.

In FIG. 1, a donor substrate 100 includes a number of components 102 (e.g., epitaxial layers) formed using a first process (e.g., crystalline growth). The components 102 may include one or more layers of materials that have been processed via photolithography and/or other processes to attain a final shape and position on the substrate 100. A sacrificial layer may also be included between the components 102 and the substrate 100 to allow separation. This fabrication could include some or all of the following: epitaxial material layer, adhesion or protection layers, carrier layers (to increase thickness for easier transport), bonding layers to aid in best print transfer, and integration layers to enable subsequent integration (e.g., stop features to allow planarization after integration).

Figure 2:
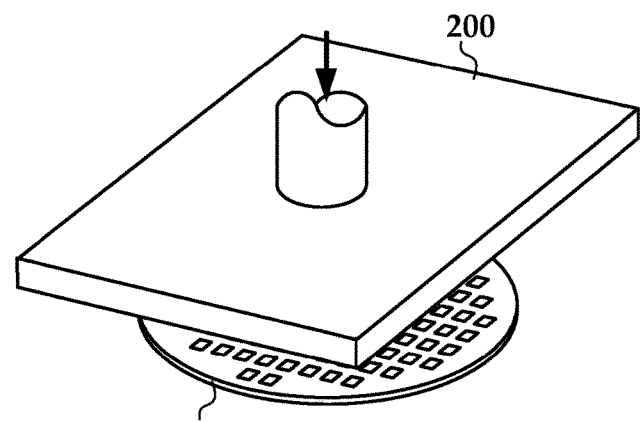
Figure 3:
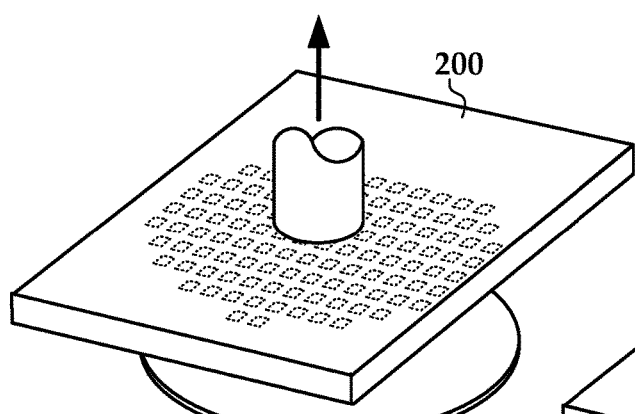

As seen in FIG. 2, a transfer print head 200 is lowered onto the substrate material (or material stack) onto a target substrate (typically of a different material). The transfer print head 200 is lifted as shown in FIG. 3, taking the components 102 with it. In this way, "islands" of the component material are then transferred to a target substrate 210 as shown in FIGS. 4-5.

Figure 4:
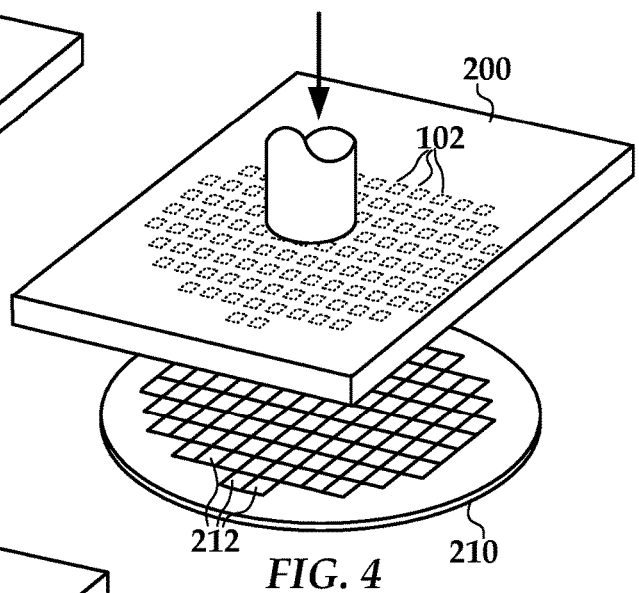
Figure 5:
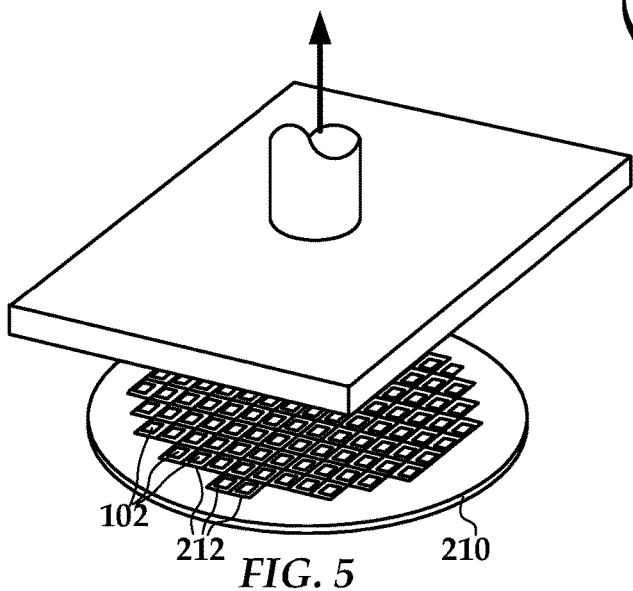

As seen in FIG. 4, the transfer print head 200 is lowered over a wafer 210 that includes a number of partially-processed recording heads 212. The transfer print head 200 presses the components 102 on to the wafer 210 and is then pulled away as seen in FIG. 5. This attaches the components 102 to the recording heads 212. Afterwards, the wafer 210 is further processed, e.g., etching the components 102 to final shape and alignment, and depositing additional layers of material to form the remaining recording head components.

Figure 6:
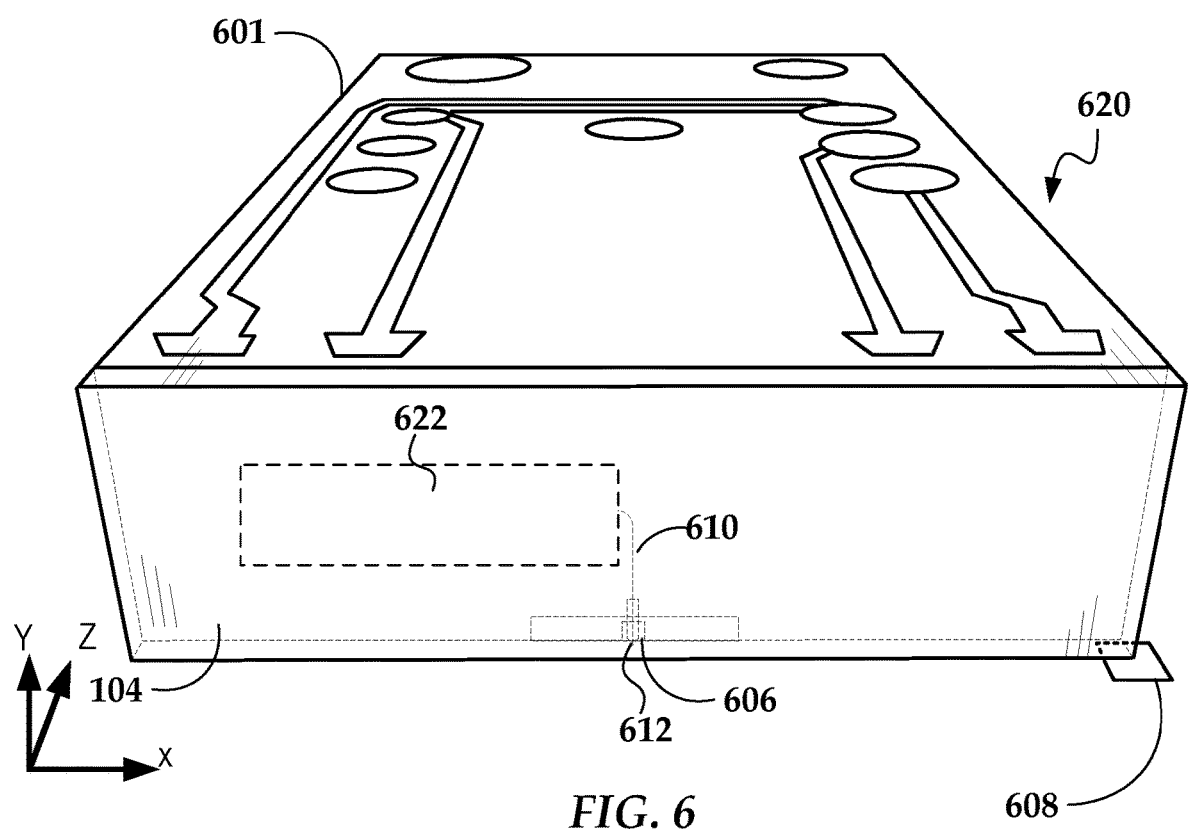
FIG. 6 is a perspective view of a slider having an On-Wafer Laser (OWL) in accordance with embodiments described herein.

FIG. 6 shows a perspective view of a HAMR write head 620 in accordance with embodiments described herein. As described above, at least part of the laser diode 622 is not self-supporting (e.g., not a separately packaged device) but is physically transferred to a target read/write head substrate that does contain already or will contain, after further processing, the other components of the read/write head (e.g., write coil and poles, reader stack) without the use of a separate or intermediate support during attachment. The laser diode 622 delivers light to a region proximate a HAMR read/write transducer 606, which is located near the media-facing surface 608. The media-facing surface 608 faces and is held proximate to the moving media surface while reading and writing to the media. The media-facing surface 108 may be configured as an air-bearing surface (ABS) that maintains separation from the media surface via a thin layer of air.

The energy is used to heat the recording media as it passes by the read/write transducer 606. Optical coupling components, such as a waveguide system 610, are formed integrally within the slider body 601 (near a trailing edge surface in this example) and function as an optical path that delivers energy from the laser diode 622 to the recording media via a near-field transducer 612. The near-field transducer 612 is located near the read/write transducer 606 and causes heating of the media during recording operations. The near-field transducer 612 may be made from plasmonic materials such as gold, silver, copper, etc.

Figure 7:
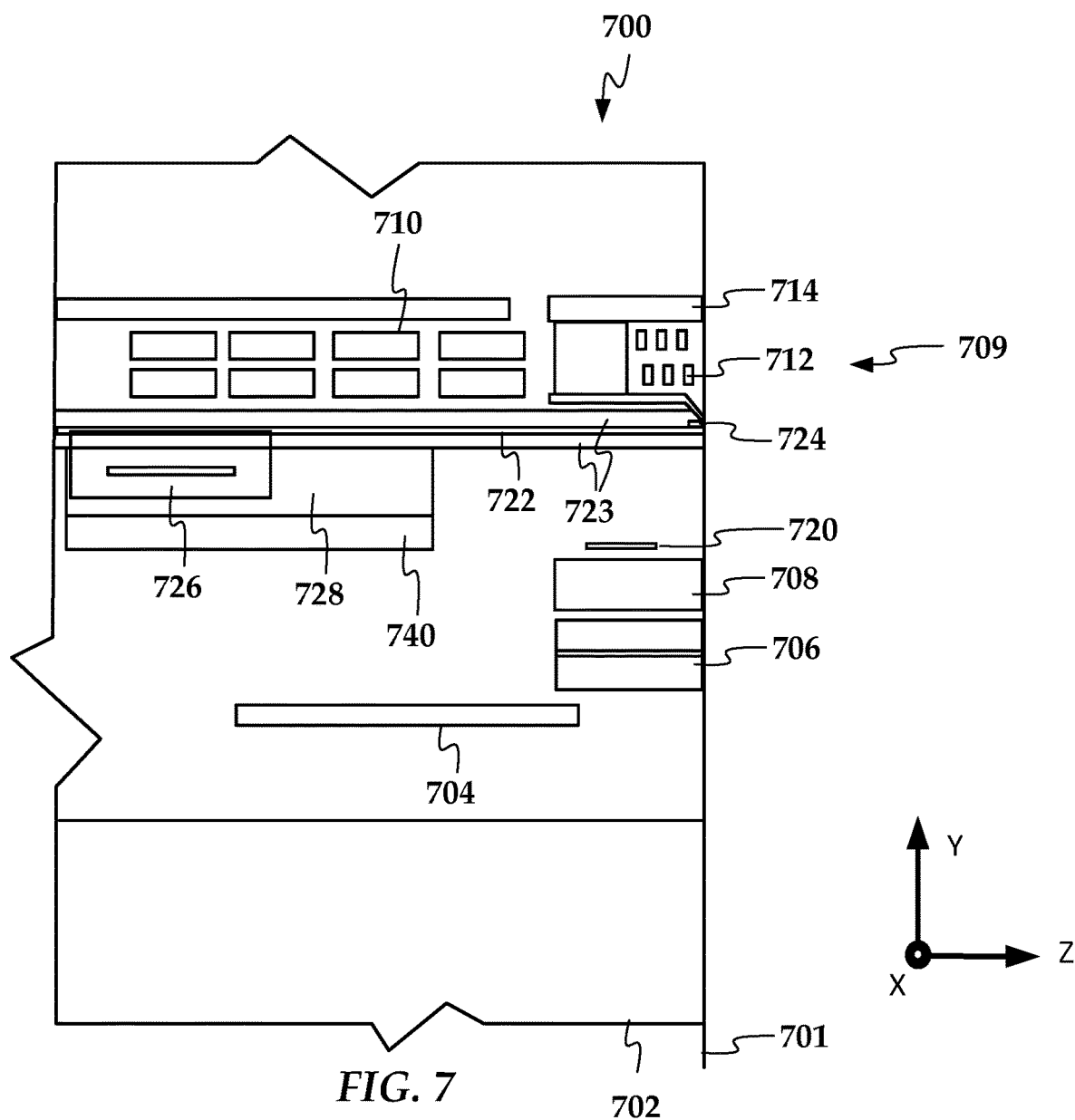
FIGS. 7-8 illustrate cross-sectional views showing an arrangements of a recording head in accordance with embodiments described herein.

The laser diode may be located in various locations in the recording head. In FIG. 7 a cross-sectional view shows an arrangement of a recording head 700 according to an example embodiment. The recording head 700 is built upon a substrate 702. A reader heater 704 and read transducer 706 are deposited over the substrate 702. The reader heater 704 induces localized thermal expansion to change a clearance between the read transducer 706 and a recording medium (not shown) that is held next to a media-facing surface 701 of the recording head 700. The read transducer 706 is typically a magnetoresistive device that changes resistance in response to local magnetic fields.

Above the read transducer 706 is a return pole 708 that is part of a magnetic write transducer 709. Also included in the write transducer 709 is a pole 708, coils 710, 712, and second return pole 714. A writer heater 720 controls writer clearance through controlled thermal expansion similar to the reader heater 702. The write transducer 709 may operate similar to a conventional (e.g., perpendicular) magnetic writer, except that additional optical components, such as waveguide core 722, waveguide cladding 723, and NFT 724, provide energy to heat the recording medium while writing.

An active laser region 726 is deposited at or below the waveguide core 722. According to varies embodiments, a heat sink 740 is deposited between the read transducer 706 and the laser diode unit 728. The active laser region 726 is part of a laser diode unit 728 formed of one or more non-self-supporting layers of crystalline material. An optical coupler may be configured to receive light from the active region 726 and couple the light to the waveguide core 722. The optical coupler may include any combination of an assistant layer, tapered waveguide section, grating, mirror, etc. The coupled light causes plasmon excitation at the near-field transducer 724 and energy to be directed to a recording medium via the near-field transducer 724. Note that the active region 726 (as well as the rest of the laser diode unit 728) is elongated in the cross-track direction (x-direction). Other optical components may also be placed along the waveguide core 722 between the active laser region 726 and the media-facing surface 701, such as a mode converter, phase converter, stray light blockers/absorbers, etc. According to various embodiments, a reader amplifier is disposed proximate the laser.

Figure 8:
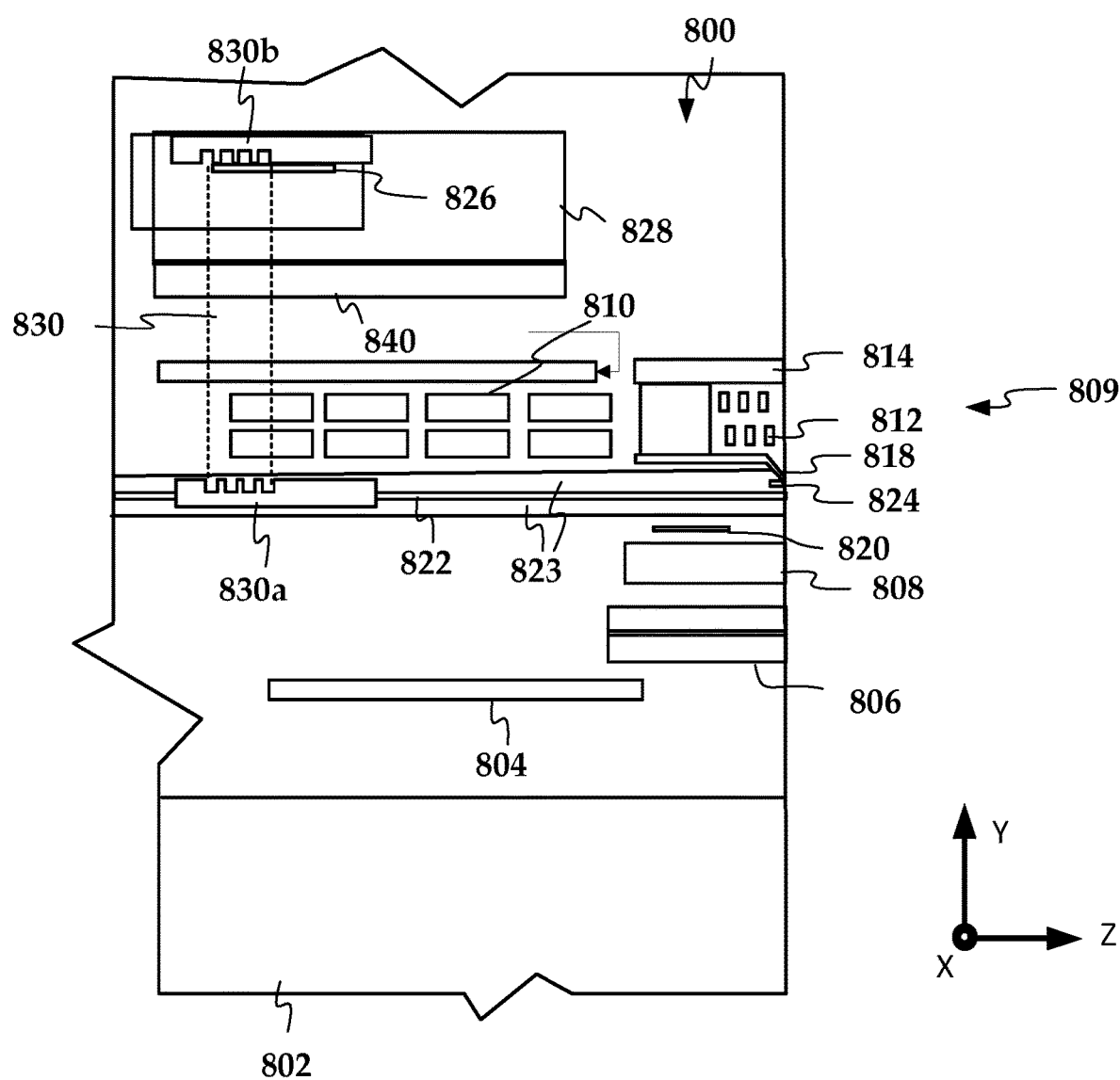

FIG. 8 is a cross-sectional view showing an arrangement of a recording head 800 according to an example embodiment. The recording head 800 is built upon a substrate 802. A reader heater 804 and read transducer 806 are deposited over the substrate 802. Above the read transducer 806 is a return pole 808 of a magnetic write transducer 809 that also includes write pole 818, coils 810, 812, and second return pole 814. A writer heater 820, waveguide core 822, waveguide cladding 823, and NFT 824 are also shown. Unless otherwise indicated, the recording head 800 and constituent features/components shown in FIG. 8 are similar to analogous components shown in FIG. 7 and described above, and may be modified as indicated in the description of that embodiment.

An active laser region 826 is deposited after the write transducer. The active laser region 826 is part of a laser diode unit 828. A heat sink 840 is deposited between the laser diode unit 828 and components of the recording head 800. The heat sink 840 couples the laser diode 828 to the surrounding structures and causes heat flow away from the laser diode unit 828. An optical coupler 830 is configured to receive light from the active region 826 and couple the light to the waveguide core 822. In this case, there is a down-track (y-direction) separation between the active laser region 826 and the waveguide core 822, so the optical coupler 830 includes features, such as the illustrated gratings 830*a-b*, that direct the light in the down-track direction. In other configurations, mirrors can be used instead of the gratings 830*a-b*, or a mixture of mirrors and gratings can be used. As an example of the latter, a mirror could be used in place of grating 830*b* to direct light out of the laser diode unit 828, while grating 830*a* is used to receive light reflected from the mirror.

Figure 9A:
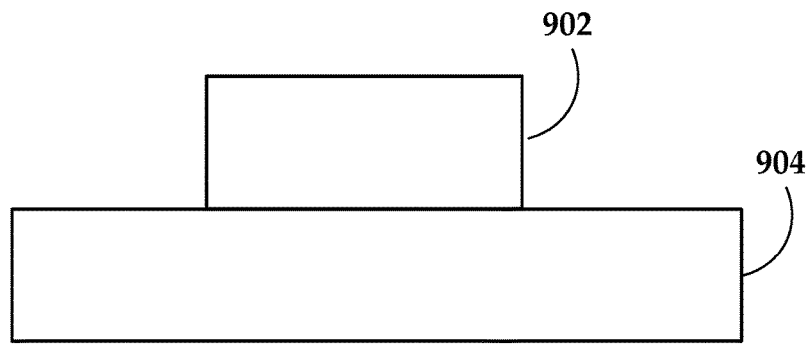
FIG. 9A shows a cross section of a heat sink and a structure in accordance with embodiments described herein.

In some cases, the heat sink may provide heat sinking and/or bonding for various transfer printed structures in the recording head. FIG. 9A shows a cross section of a heat sink 904 and a structure 902. According to various embodiments, the structure may include the laser diode unit and/or a reader amplifier. Properties of heat sink layer and/or layers adjacent to the structure 902 may be chosen to match a coefficient of thermal expansion and/or other property of the structure 902 to facilitate bonding of the structure 902 to the heat sink 904. In some cases, the material of the heat sink layer and/or layers directly adjacent to the structure 902 are chosen to substantially match a coefficient of thermal expansion of the structure 902.

Figure 9B:
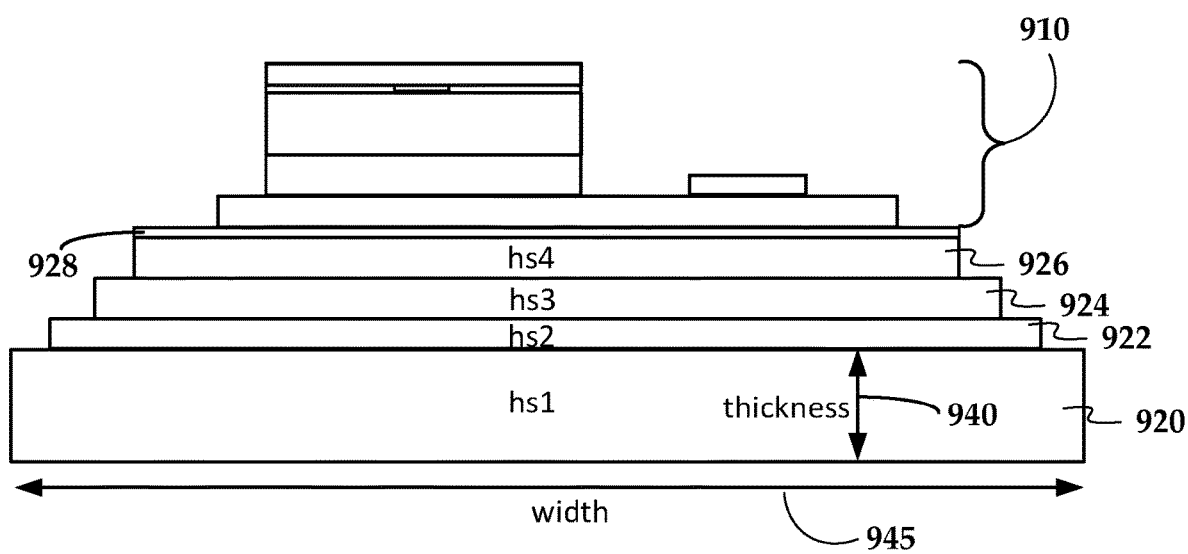
FIG. 9B-9C show views of a heat sink having a plurality of layers in accordance with embodiments described herein.
Figure 9C:
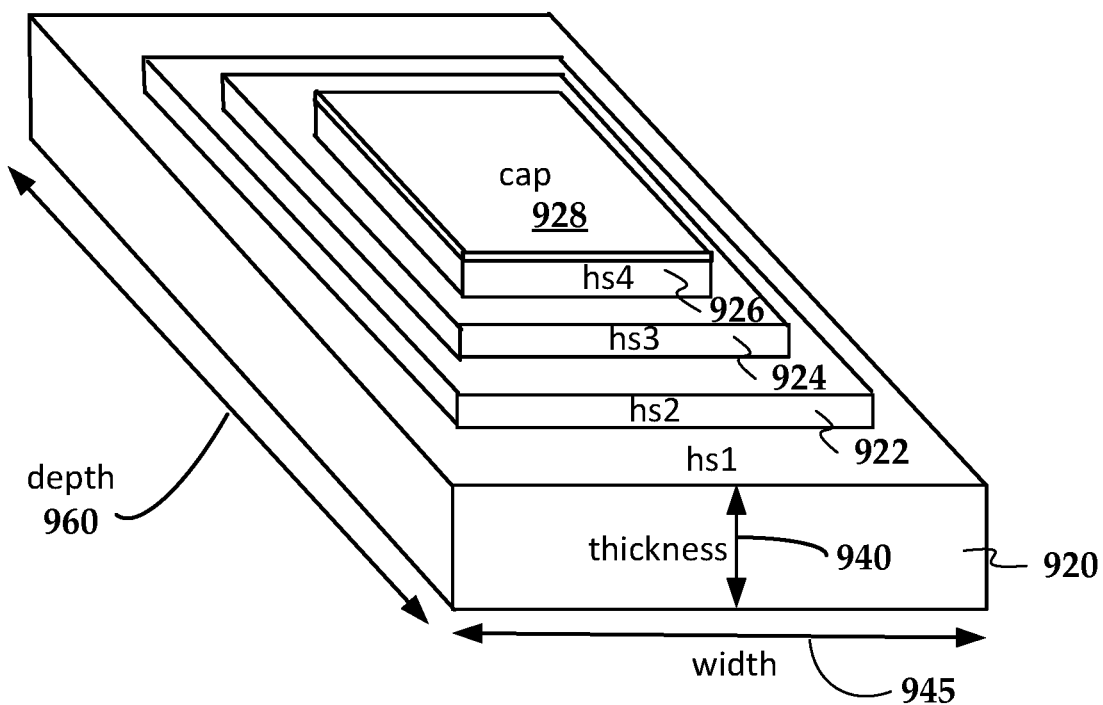

FIGS. 9B and 9C show more detailed views of a heat sink and laser diode 910 that can be used with various embodiments described herein. The heat sink may be configured to cause heat to flow away from the laser diode and/or the reader amplifier. In this example, the heat sink has a plurality of layers 920, 922, 924, 926, 928. The materials, widths, thicknesses, and/or other properties of the layers 920, 922, 924, 926, 928 may be chosen to reduce corrosion, increase performance, and/or provide good contact between the laser diode and/or reader amplifier and the substrate of the slider and/or other surrounding components. Each of the layers 920, 922, 924, 926, 928 has a thickness, a width, and a depth. For example, the thickness dimension 940, the width dimension 945, and the depth dimension 960 are shown for hs1 920 in FIGS. 9B and 9C.

In this example, the heat sink includes five layers 920, 922, 924, 926, 928 including a cap layer 928 that is in direct contact with the laser diode 910. The heat sink layers 920, 922, 924, 926, 928 may comprise various materials. For example, at least one and/or each of the layers 920, 922, 924, 926, 928 may comprise one or more of AlN, Cu, NiFe, NiCr, CuW, and Au. In some cases, adjacent heat sink layers comprise different materials and/or thicknesses from one another. According to some embodiments, adjacent heat sink layers comprise the same material and/or the same thickness. Each of the heat sink layers 920, 922, 924, 926, 928 may comprise a different material and/or a different thickness than any other heat sink layer 920, 922, 924, 926, 928.

Properties of heat sink layer and/or layers adjacent to the laser diode 910 and/or the reader amplifier may be chosen to match a coefficient of thermal expansion and/or other property of the laser diode 910 to facilitate bonding of the laser diode 910 and/or reader amplifier to the heat sink. In some cases, the material of the heat sink layer and/or layers directly adjacent to the laser diode 910 and/or the reader amplifier is chosen to substantially match a coefficient of thermal expansion of the laser diode 910 and/or the reader amplifier. For example, the cap layer 928 material and/or thickness may be chosen to match the thermal coefficient of expansion of the laser 910 and/or the reader amplifier.

According to various embodiments, at least some of the heat sink layers 920, 922, 924, 926, 928 are staggered such they do not have a same width. The staggered configuration may be done to avoid oxidation, for example. In a staggered layer configuration, at least some of the layers 920, 922, 924, 926, 928 have different widths than other layers of the plurality of layers. In some cases, each of the layers 920, 922, 924, 926, 928 has a different width than any other of the layers. In the example shown in FIGS. 9B and 9C, all of the layers hs1 920, hs2 922, hs3 924, and hs4 926 have different widths from each other, while hs4 926 and the cap layer 928 have substantially the same width. In some cases, the cap layer 928 has a different width from any adjacent heat sink layers. A total thickness of the heat sink layers 920, 922, 924, 926, 928 may be in a range of about 8 μm to about 14 μm or about 10 μm to about 12 μm. According to various implementations, the total thickness of the heat sink is about 11.4 μm. Table 1 shows example materials, thicknesses, widths, and depths for the five heat sink layers 920, 922, 924, 926, 928.

TABLE 1

| Layer | Material | Thickness (μm) | Width (μm) | Depth (μm) |
|---|---|---|---|---|
| cap 928 | AlN | 0.5 | 40 | 240 |
| hs4 926 | Cu | 2.0 | 40 | 240 |
| hs3 924 | NiFe | 2.0 | 44 | 244 |
| hs2 922 | NiFe | 1.5 | 48 | 248 |
| hs1 920 | Cu | 5.4 | 52 | 252 |

Figure 10A:
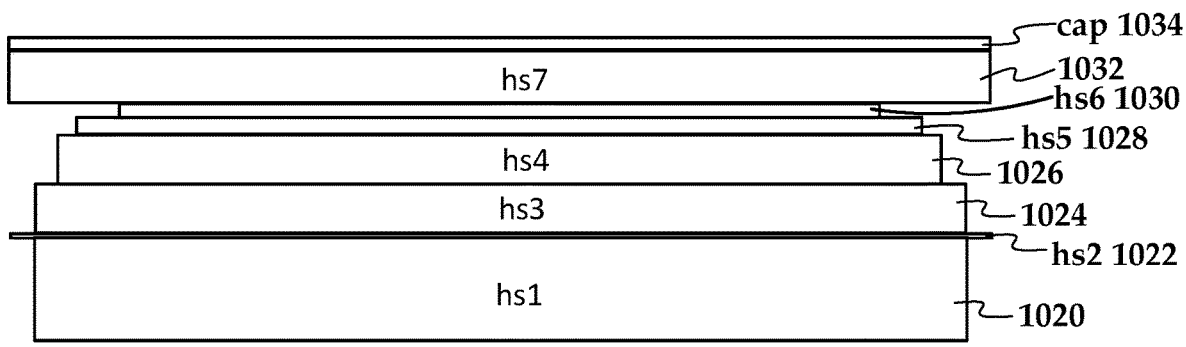
FIGS. 10A-10C illustrate heat sink configurations having a plurality of layers in accordance with embodiments described herein.
Figure 10B:
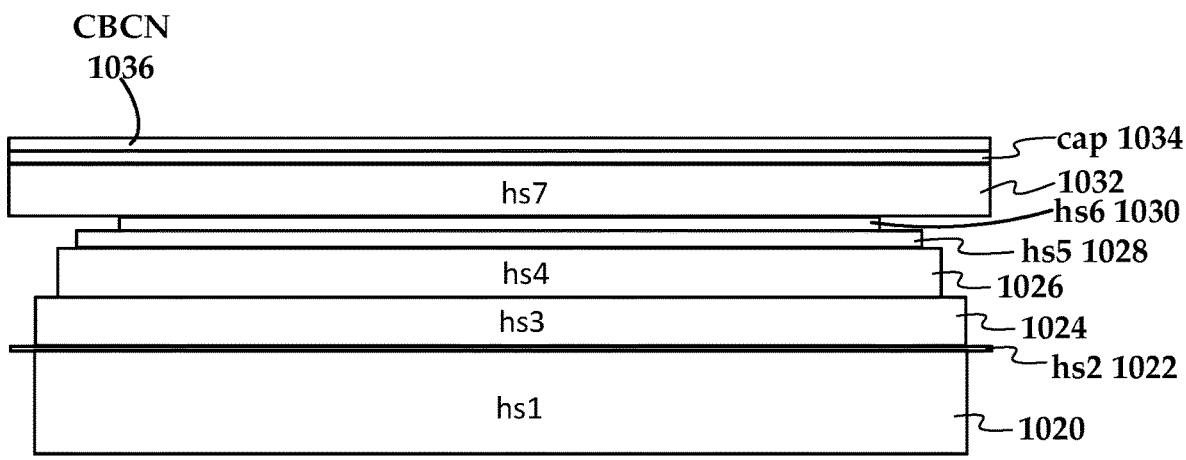

While FIGS. 9A and 9B illustrate a heat sink in which the layers generally show a tapering width as the heat sink approached the laser, some embodiments may have different configurations. FIGS. 10A and 10B show other embodiments of heat sink layers. Similarly to the example shown in FIGS. 9A and 9B, the each of the heats sink layers 1020, 1022, 1024, 1026, 1028, 1030, 1032, 1034 of FIGS. 10A and 10B may comprise one or more of AlN, Cu, NiFe, NiCr, and CuW. In some cases, adjacent heat sink layers comprise different materials and/or thicknesses. Adjacent heat sink layers may comprise the same material and/or the same thickness. Each of the heat sink layers may comprise a different material and/or a different thickness than any other heat sink layer. The cap layer 1034 material and/or thickness may be chosen to match a coefficient of thermal expansion of the laser diode. According to various embodiments, at least some of the heat sink layers staggered such they do not have a same width so as to avoid oxidation. A total thickness of the heat sink layers 1020, 1022, 1024, 1026, 1028, 1030, 1032, 1034 may be in a range of about 9 μm to about 15 μm or about 11 μm to about 14 μm. According to various implementations, the total thickness of the heat sink is about 12.78 μm. Table 2 shows example materials, thicknesses and dimensions for the heat sink layers of FIGS. 10A and 10B. FIG. 10B illustrates an additional layer 1036, that directly interfaces with the laser diode

TABLE 2

| Layer | Material | Thickness (μm) | Width (μm) | Depth (μm) |
|---|---|---|---|---|
| cap 1034 | AlN | 0.5 | 40 | 240 |
| hs7 1032 | NiFe | 1.8 | 40 | 240 |
| hs6 1030 | Cu | 0.8 | 31 | 231 |
| hs5 1028 | NiFe | 1.3 | 34.5 | 234.5 |
| hs4 1026 | NiFe | 2.0 | 36 | 236 |
| hs3 1024 | Cu | 0.85 | 38 | 238 |

TABLE 2-continued

| Layer | Material | Thickness (μm) | Width (μm) | Depth (μm) |
|---|---|---|---|---|
| hs2 1022 | NiCr | 0.18 | 40 | 240 |
| hs1 1020 | NiFe | 4.5 | 38 | 238 |

Figure 10C:
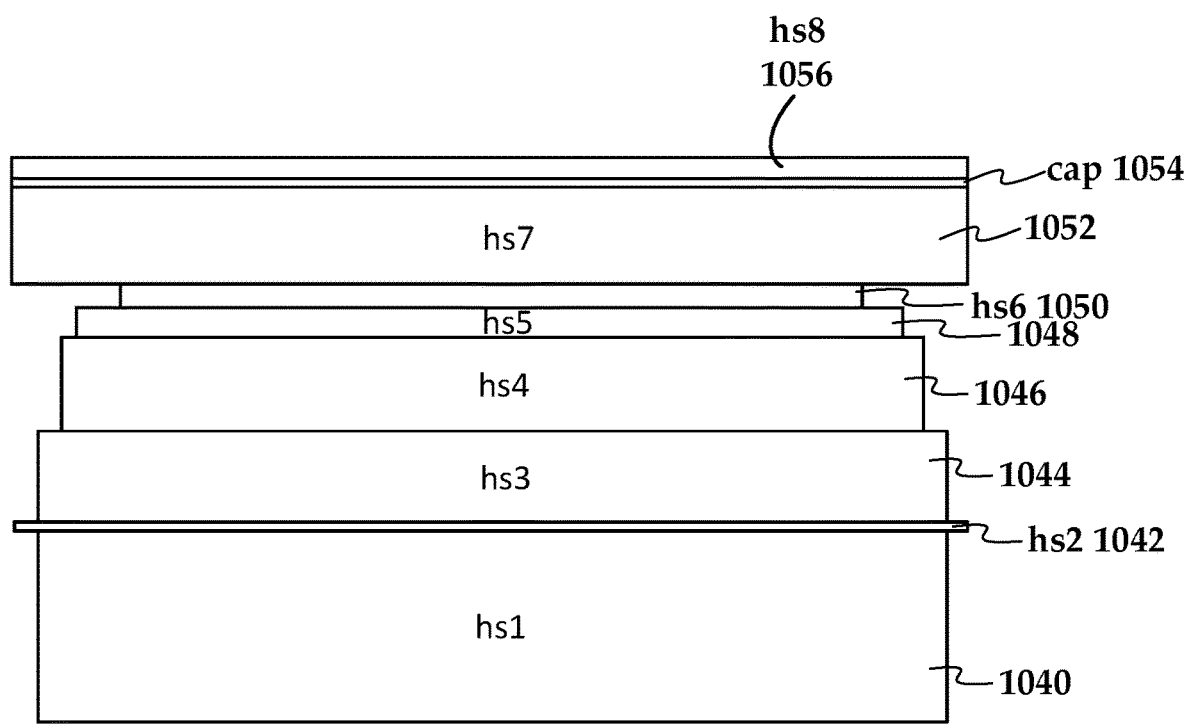

FIG. 10C illustrates another heat sink configuration. In this example, a heat sink layer hs8 1056, is disposed over the cap layer 1054 similarly to the embodiment shown in FIG. 10B. Additional heat sink layers 1040, 1042, 1044, 1046, 1048, 1050, 1052 are disposed under the cap layer 1054 away from the laser. Table 3 shows example materials, thicknesses and dimensions for the heat sink layers of FIG. 10C. While FIGS. 9A-10C show various embodiments of heat sink layers, it is to be understood that there may be more or fewer layers and the layers may have different properties than what is shown.

TABLE 3

| Layer | Material | Thickness (μm) | Width (μm) | Depth (μm) |
|---|---|---|---|---|
| hs8 1056 | CuW | 0.5 | 40 | 240 |
| cap 1054 | AlN | 0.1 | 40 | 240 |
| hs7 1052 | NiFe | 1.8 | 40 | 240 |
| hs6 1050 | Cu | 0.8 | 31 | 231 |
| hs5 1048 | NiFe | 1.3 | 34.5 | 234.5 |
| hs4 1046 | NiFe | 2.0 | 36 | 236 |
| hs3 1044 | Cu | 0.85 | 38 | 238 |
| hs2 1042 | NiCr | 0.18 | 40 | 240 |
| hs1 1040 | NiFe | 4.5 | 38 | 238 |

Figure 11:
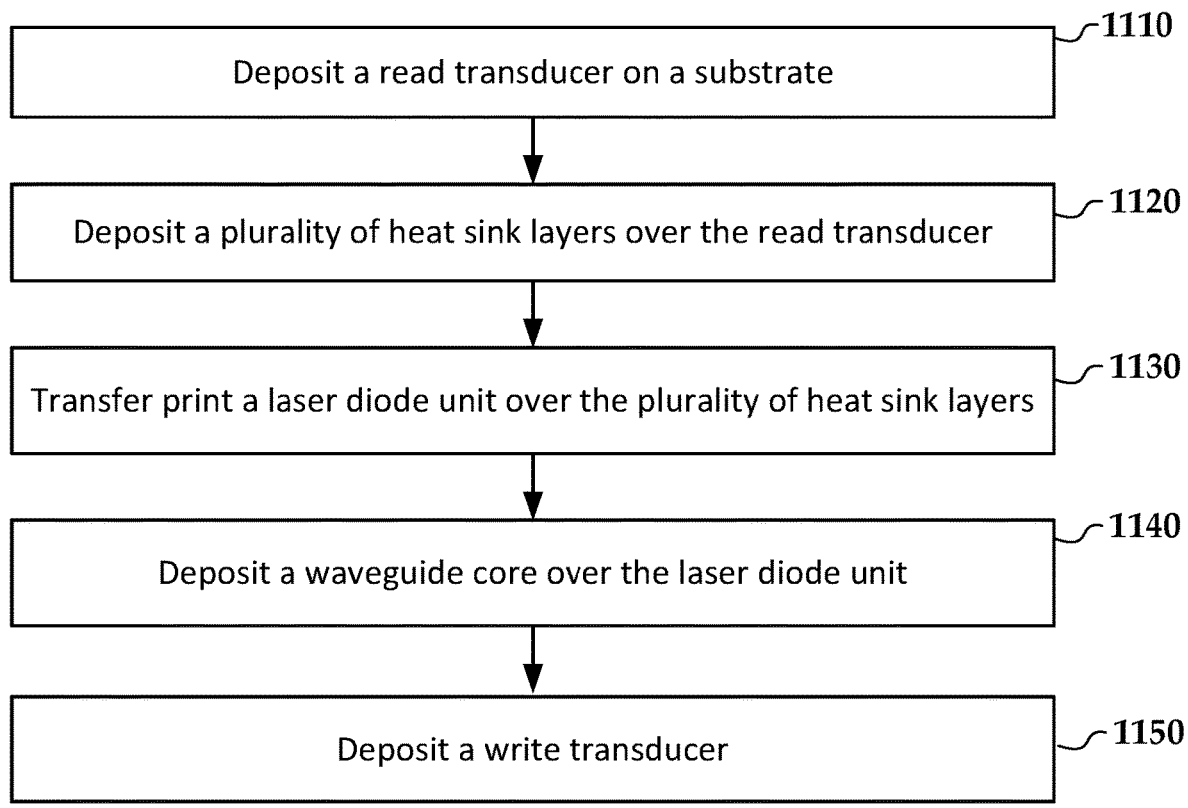
FIG. 11 illustrates a process for forming an OWL device having a plurality of heat sink layers in accordance with embodiments described herein.

FIG. 11 illustrates a process for forming an OWL device having a plurality of heat sink layers. A read transducer (e.g., a read element between a pair of reader shields) is deposited 1110 on a substrate. For example, the read transducer is deposited on an AlTiC substrate. In some cases, a reader heater is deposited between the read transducer and the substrate. A return pole for a write transducer may be deposited over the read transducer. A plurality of heat sink layers are deposited 1120 over the read transducer. A laser diode unit is transfer printed 1130 over the plurality of heat sink layers. According to various embodiments, the plurality of heat sink layers provide contact between the laser diode unit and the substrate and sink heat away from the laser diode unit. A waveguide core is deposited 1140 over the laser diode unit. According to various implementations, a write transducer is deposited 1150 over the waveguide core.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. An apparatus, comprising:
   a substrate;
   a reader deposited on the substrate;
   a laser formed on a non-self supporting structure and bonded to the substrate;
   a plurality of heat sink layers deposited between the reader and the laser and configured to provide thermal coupling between the substrate and the laser and sink heat away from the laser; and
   a waveguide deposited proximate the laser, the waveguide configured to communicate light from the laser to a near-field transducer that directs energy resulting from plasmonic excitation to a recording medium.

2. The apparatus of claim 1, wherein at least one heat sink layer adjacent the laser has substantially a same coefficient of thermal expansion as that of the laser.

3. The apparatus of claim 1, wherein the waveguide is deposited over the laser.

4. The apparatus of claim 1, wherein a writer is deposited over the waveguide.

5. The apparatus of claim 1, wherein at least one of the plurality of heat sink layers comprises a different material than at least one other of the plurality of heat sink layers.

6. The apparatus of claim 1, wherein at least one of the plurality of heat sink layers comprises at least one of NiFe, NiCr, Cu, AlN, CuW, and Au.

7. The apparatus of claim 1, wherein at least one of the plurality of heat sink layers has a different thickness than at least one other of the plurality of heat sink layers.

8. The apparatus of claim 1, wherein each of the heat sink layers of the plurality of heat sink layers has a different thickness than any of the other of the plurality of heat sink layers.

9. The apparatus of claim 1, further comprising a reader amplifier, wherein the plurality of heat sink layers are configured to provide thermal coupling between the substrate and the reader amplifier and sink heat away from the reader amplifier.

10. An apparatus, comprising:
    a waveguide core deposited on a substrate within a slider, the waveguide core configured to communicate light from a laser to a near-field transducer that directs energy resulting from plasmonic excitation to a recording medium;
    a structure transfer-printed and bonded to the substrate within the slider such that a major surface of the structure is substantially parallel to, and the structure is offset in a down-track direction from, a major surface of the waveguide core; and
    a plurality of heat sink layers deposited between the substrate and the structure and configured to provide thermal coupling between the slider and the structure and to sink heat away from the structure.

11. The apparatus of claim 10, wherein the structure is a reader amplifier.

12. The apparatus of claim 10, wherein the structure is a laser.

13. The apparatus of claim 10, wherein at least one heat sink layer adjacent the structure has substantially a same coefficient of thermal expansion as that of the structure.

14. The apparatus of claim 10, wherein at least one of the plurality of heat sink layers comprises a different material than at least one other of the plurality of heat sink layers.

15. The apparatus of claim 10, wherein at least one of the plurality of heat sink layers comprises at least one of NiFe, NiCr, Cu, AlN, CuW, and Au.

16. The apparatus of claim 10, wherein at least one of the plurality of heat sink layers has a different thickness than at least one other of the plurality of heat sink layers.

17. A method, comprising:
 depositing a read transducer on a substrate;
 depositing a plurality of heat sink layers over the read transducer,
 transfer printing a laser diode unit over the plurality of heat sink layers; and
 depositing a waveguide core over the laser diode unit, wherein the plurality of heat sink layers are configured to provide thermal coupling between the laser diode unit and the substrate and to sink heat away from the laser diode unit.

18. The method of claim 17, further comprising, depositing a write transducer over the waveguide core.

19. The method of claim 17, wherein at least one of the plurality of heat sink layers comprises at least one of NiFe, NiCr, Cu, AlN, and CuW.

20. The method of claim 17, wherein at least one heat sink layer adjacent the laser has substantially a same coefficient of thermal expansion as that of the laser.

\* \* \* \* \*